United States Patent
Mo et al.

(10) Patent No.: US 6,456,547 B1
(45) Date of Patent: Sep. 24, 2002

(54) SEMICONDUCTOR MEMORY DEVICE WITH FUNCTION OF REPAIRING STAND-BY CURRENT FAILURE

(75) Inventors: Hyun-Sun Mo, Seoul; Du-Eung Kim; Choong-Keun Kwak, both of Suwon, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 33 days.

(21) Appl. No.: 09/689,098

(22) Filed: Oct. 12, 2000

(30) Foreign Application Priority Data

Feb. 3, 2000 (KR) .............................................. 00-5317

(51) Int. Cl.⁷ ................................................. G11C 7/00
(52) U.S. Cl. ........................ 365/203; 365/200; 365/205
(58) Field of Search ................................. 365/203, 200, 365/205

(56) References Cited

U.S. PATENT DOCUMENTS 4,587,639 A * 5/1986 Aoyama et al. ............ 365/200
4,639,895 A * 1/1987 Iwahashi et al. ........... 365/200
5,703,816 A * 12/1997 Nam et al. .................. 365/200
6,298,005 B1 * 10/2001 Landry ....................... 365/233

* cited by examiner

*Primary Examiner*—David Nelms
*Assistant Examiner*—Connie C. Yoha
(74) *Attorney, Agent, or Firm*—F. Chau & Associates, LLP

(57) ABSTRACT

A semiconductor memory device having memory cells connected with pairs of bit lines and word lines comprises a pre-charging part for pre-charging a pair of bit lines in response to a first state control signal at a stand-by mode of the semiconductor memory device; a bit line charging control part for generating a second state control signal to the pre-charging part when a stand-by current failure occurs due to defect in the pair of bit lines, wherein the second state control signal is independent of a pre-charge relating signal externally applied and the pre-charging part cuts-off a supply voltage from being applied to the pair of bit lines with defect; and a bit line floating prevent part for compensatively fixing potential values of the pair of bit lines with defect so that a cell supply voltage is prevented from being applied to the pair of bit lines with defect at a memory access mode of the semiconductor memory device, so that a hard type defect like a stand-by current failure can be repaired regardless of a logic state of a pre-charge control signal, thereby reducing the probability of occurrence of defect in a semiconductor memory device.

18 Claims, 3 Drawing Sheets

SEMICONDUCTOR MEMORY DEVICE WITH FUNCTION OF REPAIRING STAND-BY CURRENT FAILURE

BACKGROUND OF THE INVENTION

1. Field of the Invention

The present invention relates to a semiconductor memory device, and more particularly to a volatile semiconductor memory device having a function of repairing a stand-by current failure.

2. Description of the Prior Art

There has been a growing trend in manufacturing of semiconductor memory devices with higher integration density. One way to accomplish high integration in a semiconductor memory device is to reduce the size of a memory cell unit to make it possible for integrating more memory cells are integrated within a given area. As integrated memory devices became more dense, the probability of occurrence of defect in memory cells in a memory device increases, thus yield of good semiconductor memory devices decreases. To maintain high yield, redundant memory cells are used. For example, a memory cell having a defect can be replaced with a redundant memory cell under control of a decoding signal generated from a redundancy circuit in a semiconductor memory device.

When a memory cell is tested to be defective, a programmable fuse in a redundancy circuit is cut off to achieve a redundancy operation. If an address signal is input to select a normal memory cell having a defect in a memory access mode, a redundancy decoder, instead of a normal decoder associated with normal memory cells, is enabled by a defective address program using the fuse in the redundancy circuit. As a result, an access is made to a redundancy memory cell instead of the normal memory cell having a defect.

Smaller memory cell units mean smaller spacings or gaps between conductor wires. As such, there is a higher risk of a hard type defect, such as a short-circuit between a bit line and ground or between a pair of bit lines and ground. Such a short-circuit causes a phenomenon called a stand-by current failure, in which excessive current flows through the ground at a stand-by state of a semiconductor memory device. The problem of a stand-by current failure cannot be effectively solved by a redundancy circuit having a fuse to be programmed, by which a normal memory cell having a defect is replaced with a redundancy memory cell. This is because a supply voltage is still applied to a pair of bit lines connected with the normal memory cell having a defect through a pre-charging transistor or the like.

A system for repairing a stand-by current failure by use of a conventional technique was proposed in U.S. Pat. No. 5,390,150 to Choong-Keun Kwak et al., issued on Feb. 14$^{th}$, 1995 being titled "SEMICONDUCTOR MEMORY DEVICE WITH REDUNDANCY STRUCTURE SUPPRESSING POWER CONSUMPTION." In the aforementioned patent, a cutting element like a fuse is connected to a supply voltage or a pre-charge signal. In case that a stand-by current failure is detected, the fuse is cut off to selectively stop the supply voltage from being supplied to a defective bit line. However, if a repair is made to a unit of a column, a common word line connected with a memory cell associated with a defective bit line may still be used for a cell supply voltage to be applied to the memory cell. Therefore, if there is a short-circuit between a bit line and ground, there is a problem that leaking current flows to the ground through the short-circuited bit line.

Another conventional method and system for repairing a stand-by current failure in a semiconductor memory device can be found in Japanese patent No. Heisei 7-122097. In a 4-transistor cell type static memory device, the power for a leak current compensating circuit is supplied by a bit line pre-set control signal to prevent stand-by leak current from flowing through a defective bit line; otherwise the stand-by leak current would flow in spite of cutting off a fuse connected to the defective bit line.

In the above proposed method, even if a fuse between a voltage supply and a pre-charge transistor is cut off in the case of stand-by current failure, the pre-charge transistor still receives a pre-set control signal at its gate, which alternately shifts between high and low levels in response to transitions between a memory access mode and a stand-by mode of a semiconductor memory device. As a result, a leak current path is formed in the semiconductor memory device. Therefore, it is practically difficult to prevent current from leaking in a stand-by mode or in a memory access mode of a semiconductor memory device.

Therefore, a need exists for a semiconductor memory device having function of repairing a stand-by current failure such that leak current is eliminated in stand-by and memory access modes.

SUMMARY OF THE INVENTION

The present invention is provided to solve the aforementioned problems and other problems in the conventional method and apparatus for repairing stand-by current failure in semiconductor memory devices.

It is an object of the present invention to provide a static random access memory device that can effectively repair a stand-by current failure.

It is another object of the present invention to provide a method for preventing formation of a current path where current flows through a defective bit line.

It is further another object of the present invention to provide a method and apparatus for repairing a hard type defect occurred in a semiconductor memory device, wherein the repair is performed independent of a pre-charge control signal.

It is still another object of the present invention to provide a method and apparatus for preventing leak current from flowing through a defective bit line at a stand-by mode or a memory access mode of a semiconductor memory device.

To accomplish the aforementioned objects of the present invention, there is provided a semiconductor memory device having a plurality of memory cells, and pairs of bit lines, the plurality of memory cells being connected with a pair of bit lines, the semiconductor memory device includes a pre-charging part for pre-charging one pair of the pairs of bit lines in response to a first state control signal output at a stand-by mode of the semiconductor memory device; a bit line charging control part for generating the first state control signal in response to a pre-charge relating signal and generating a second state control signal, the second state control signal being generated when a stand-by current failure occurs due to a defect in the one pair of bit lines, wherein the second state control signal is independent of the pre-charge relating signal and when activated, causes a circuit in the pre-charging part to cut-off supply voltage from being applied to the pair of bit lines; and a bit line floating prevent part for compensatively fixing potential values of the one pair of bit lines having defect so that a cell supply voltage is prevented from being applied to the pair of bit lines during a memory access mode of the semiconductor memory device.

It is preferable that the bit line charging control part comprises a fuse with one of its terminals to be connected to the supply voltage; an NMOS transistor with its drain and gate being commonly connected to the other terminal of the fuse and its source being connected to ground supply voltage; and a NAND gate for receiving a logic state obtained at the other terminal of the fuse and that of a pre-charge relating signal to generate a NAND response as a control signal.

In addition, it is preferable that the bit line floating prevent part comprises a pair of cross-coupled PMOS transistors with drains being commonly connected to the supply voltage and sources being respectively connected to the gates that are also respectively connected to the pair of bit lines in opposite.

In accordance with the other aspect of the present invention, there is provided a method for repairing a stand-by current failure in a static random access memory having memory cells connected with pairs of bit lines in column direction and word lines in row direction, the method comprising the steps of generating a pre-charge prevent signal to prevent a supply voltage from being applied to a pair of bit lines when at least one of the pair of bit lines is defective; and blocking a current path through which a cell supply voltage is applied to the defective one of the pair of bit lines at a memory access mode by compensatively fixing potential values of the pair of bit lines.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF PREFERRED EMBODIMENTS

Figure 1:
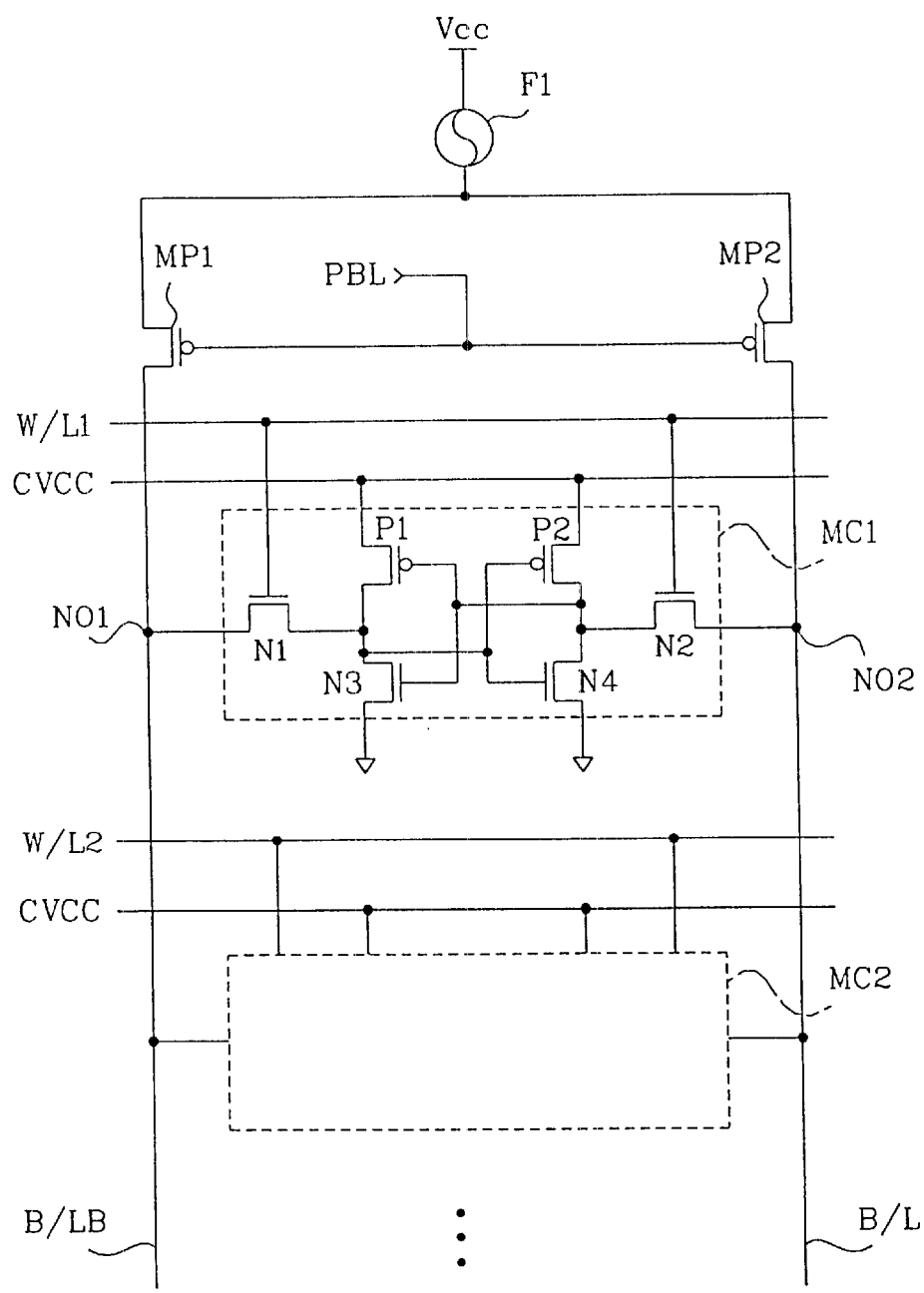
FIG. 1 is a circuit diagram for illustrating a part of a conventional semiconductor memory device having redundancy memory cells for repairing a stand-by current failure.

Objects and aspects of the invention will become apparent from the following detailed description of preferred embodiments with reference to the accompanying drawings. Throughout the drawings, it should be noted that like reference numerals are used for designation of like or equalizers or portion for simplicity of illustration and explanation, detailed description of which will be omitted. Conventional technique will be described to make the invention more apparent and thoroughly understood.

Referring to FIG. 1, there is provided a circuit diagram for illustrating a part of a conventional semiconductor memory device in a structure having redundancy memory cells (not shown) for repairing a stand-by current failure. The conventional semiconductor device partially depicted in FIG. 1 is a full metal oxide semiconductor (MOS) type static random access memory (SRAM) device. A full MOS type SRAM device has pre-charging transistors MP1,MP2 which are turned on at a stand-by mode to fix a pair of bit lines B/LB,B/L at a level of supply voltage Vcc, and normal memory cells MC1,MC2 which are sequentially connected between the pair of bit lines B/LB,B/L arranged in column direction and also connected with word lines W/L1,W/L2 arranged in row direction. Each memory cell MC1 includes accessing pass transistors N1,N2 each of which has a gate connected to a word line W/L1, and driving transistors P1,N3, P2,N4 which are connected between cell supply voltage CVCC and ground to form cross-coupled inverter-latch structure. Although there are in FIG. 1 only two memory cells MC1,MC2 connected between a pair of bit lines, a plurality of memory cells are connected between a pair of bit lines to form a column of memory cells. A multiple columns of memory cells form a matrix of a memory cell array.

In case that there is at a stand-by mode a short-circuit between one of a pair of bit lines and a wire having ground potential due to, for example, wiring defect in a manufacturing process, the short-circuited bit line may cause a stand-by current failure. The probability of occurrence of such a hard type defect is higher as a gap between wires in a semiconductor memory device is smaller to accomplish higher integration of the semiconductor memory device. If a stand-by current failure occurs due to a defective bit-line (e.g., a short-circuited bit line), it can not be repaired with redundancy memory cells. fuse F1 connected to a supply voltage Vcc is installed in a memory device as an element to repair a stand-by current failure. If a stand-by current failure due to a defective bit line is detected at a wafer test step in a process of manufacturing semiconductor memory devices, a fuse F1 corresponding to the defective bit line is cut off by a laser beam in a repairing process. Accordingly, the supply voltage Vcc is not applied to the sources of the pre-charging transistors MP1, MP2 at a stand-by mode, so that the pair of bit lines B/LB,B/L can not be pre-charged to a level of the supply voltage Vcc. As a result, there is no current flowing to the ground through the defective bit line at a stand-by mode, thereby repairing the stand-by current failure.

However, since the conventional method for repairing a stand-by current failure is performed in a floating state of a bit line, there may be leakage current which flows through another current path. In other words, although the supply voltage Vcc is stopped from being supplied to the pairs of bit lines B/LB/,B/L, a word line W/L1 connected to the gates of the pass transistors N1,N2 of a memory cell MC1 is still enabled at a memory access mode. Thus, at a memory access mode one of driving transistors P1,P2 in a memory cell MC1 may be turned on. The turned-on driving transistor receives a low level signal at its gate. For instance, if the driving transistor P1 is turned on, a cell supply voltage CVCC is applied to a node NO1 through the pass transistor N1. Thus, the cell supply voltage CVCC becomes a current source for the bit line B/LB, so that the current flows to the ground through a short-circuited wire. As a result, there can be a problem of excessive current flow in a semiconductor memory device. At this time, a current path for the excessive current flow is formed through the defective bit line from the cell supply voltage CVCC. A level of the cell supply voltage CVCC may be or may not be equal to that of the supply voltage Vcc.

Also, the pre-charging transistors MP1,MP2 receive a pre-charge control signal PBL that shifts between high and low levels in accordance with transitions between a memory access mode and a stand-by mode of a semiconductor memory device. Since the precharging transistors MP1,MP2 are turned on or off in response to low or high level of the pre-charge control signal PBL, there may be a problem of forming a current leak path through a turned-on pre-charging transistor.

Therefore, to solve the aforementioned problems of the conventional technique, the present invention provides a semiconductor memory device having function of repairing stand-by current failure and effectively preventing current leak at a memory access mode.

Figure 2:
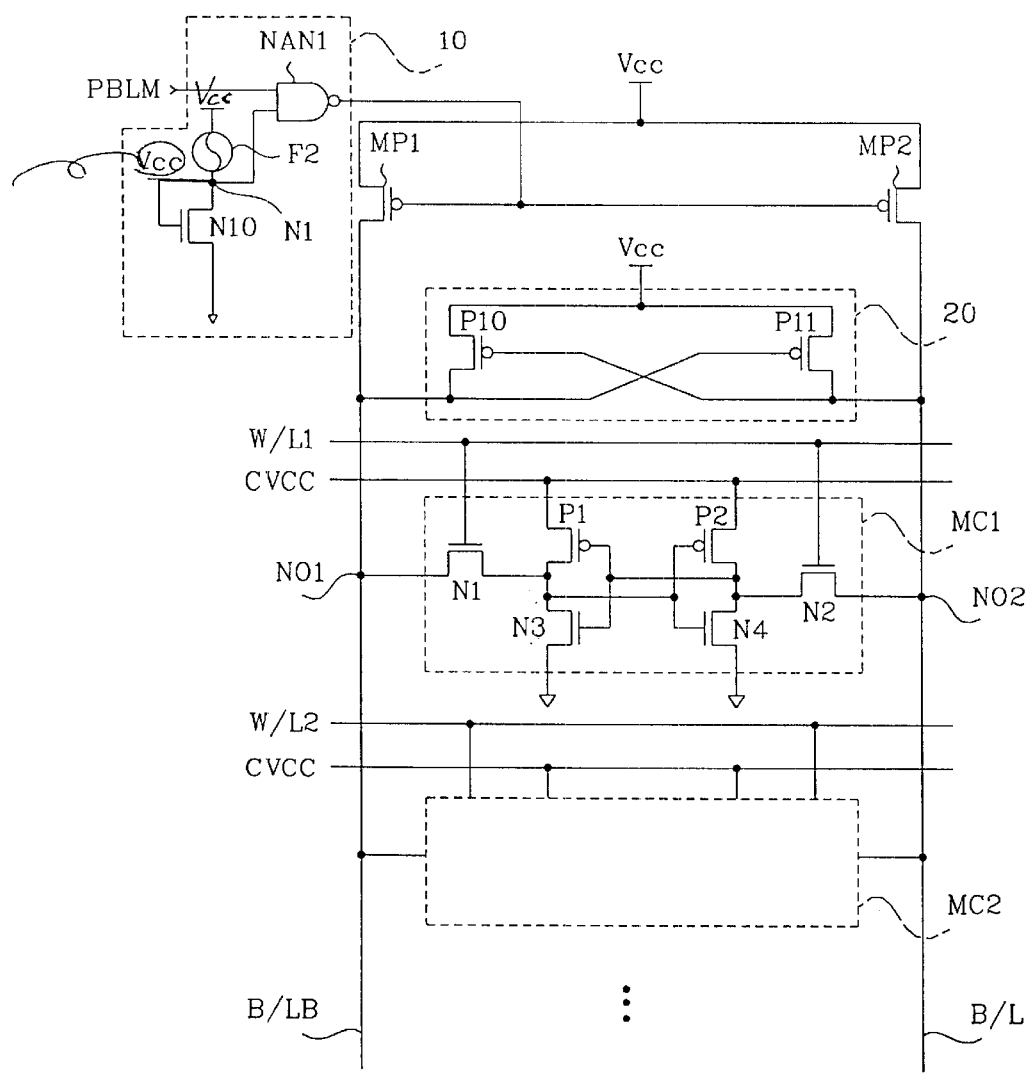
FIG. 2 is a circuit diagram of part of a semiconductor memory device having redundancy memory cells in accordance with an embodiment of the present invention.

Referring to FIG. 2, there is provided a circuit diagram for illustrating a part of a semiconductor memory device with function of repairing a stand-by current failure in accordance with an embodiment of the present invention. A semiconductor memory device in FIG. 2 includes pre-charging transistors MP1, MP2, normal memory cells MC1,MC2, a bit line charging control part 10, and a bit line floating prevent part 20. Although FIG. 2 shows only two memory cells connected with a pair of bit lines, a plurality of memory cells are connected between the bit lines to form a column of memory cells in actual memory devices. Also, multiple columns of memory cells are arranged to form a matrix of memory cell array. Such a memory cell array includes a plurality of redundancy memory cells (not shown).

The bit line charging control part 10 includes a fuse F2 connected with a supply voltage Vcc, where a connection between the fuse F2 and the supply voltage Vcc may be disconnected, an NMOS transistor N10 having drain and gate commonly connected to the other terminal of the fuse F2 and source connected to a ground voltage, and a NAND gate NAN1 for receiving a logic signal provided from the other terminal of the fuse F2 and a pre-charge relating signal PBLM to generate NAND response as a control signal. The bit line charging control part 10 generates a control signal to control a pre-charging part having the pre-charging transistors MP1,MP2. The fuse F2 may be made of polysilicon or metal. The fuse F2 may be cut off with laser beam, high current or any other method well known in this field. It is preferable to cut off a doped polysilicon fuse by "blowing" it with laser beam at wafer state.

The bit line floating prevent part 20 includes a pair of cross-coupled PMOS transistors P10,P11 of which drains are commonly connected to the supply voltage Vcc. Each of sources of the transistors P10,P11 is connected to gate of the transistor in opposite, and also connected to the opposite one of the pair of bit lines B/LB,B/L, as shown in FIG. 2.

When a hard type defect like a stand-by current failure is detected at any of a pair of bit lines B/LB,B/L in a wafer test, it can be replaced with a redundancy pair of bit lines. A fuse F2 corresponding to a defective pair of bit lines is cut off with laser beam in a fusing process. A process of cutting a fuse to be performed when a bit line contacts any wire having a level of ground voltage may be named "fuse-programming" for the sake of convenience. When being subject to the "fuse-Programming", the bit line charging control part 10 continuously generates a control signal of a second state, for instance logic high, independent of a logic state of the pre-charge relating signal PBLM. This is because a drain node N1 of the transistor N10 is fixed at logic low in case of the "fuse-programming". The pre-charge relating signal PBLM may be a source signal for generating the pre-charge control signal PBL shown in FIG. 1. Also, the pre-charge control signal PBL can be directly applied to the NAND gate NAN1 instead of the pre-charge relating signal PBLM.

Upon occurrence of the "fuse-programming", the bit line charging control part 10 generates the second state control signal (e.g., high level signal) to the gates of the pre-charging transistors MP1,MP2 in a pre-charging part. As a result, the pre-charging transistors MP1,MP2 are turned off in the case of the "fuse-programming", so that any current leak path is prevented from being formed from the supply voltage Vcc through the pair of bit lines B/L,B/LB. Therefore, there is no such problems described in the prior art that the pre-charging transistors MP1,MP2 receive the pre-charge control signal PBL that alternately shifts between high and low levels in response to transitions between a memory access mode and a stand-by mode of a memory device.

When there is no "fuse-programming", the bit line charging control part 10 generates a control signal in response to the pre-charge relating signal PBLM. For example, the NAND gate NAN1 receiving the pre-charge relating signal PBLM generates a control signal with a first state (i.e., logic low) at a stand-by mode, while generating a control signal with a second state (i.e., logic high) at a memory access mode where read or write operation is performed.

In other words, the pre-charging transistors MP1,MP2 in a pre-charging part always receive a logic high control signal from the bit line charging control part 10 in case of the "fuse-programming", so that the supply voltage Vcc is continuously stopped from being applied to the pair of bit lines B/LB,B/L. In the case of no "fuse-programming", the pre-charging transistors MP1,MP2 turned on by a logic low control signal so that the pair of bit lines B/LB,B/L are pre-charged to a level of the supply voltage Vcc. At a memory access mode, the pre-charging transistors MP1, MP2 are turned off by a logic high control signal, so that the supply voltage Vcc can not be supplied to the pair of bit lines.

Now, functions and operations of the bit line floating prevent part 20 will be described. In case of the "fuse-programming", the pair of cross coupled PMOS transistors P10, P11 stop a cell supply voltage CVCC from being applied to a defective bit line at a memory access mode by compensating potential values of the pair of bit lines B/LB, B/L to have fixed potential values. If a node NO1 in the bit line B/LB is set at logic high state, a node NO2 in the bit line B/L turns to logic low state. The pair of PMOS transistors P10, P11 will hold the node NO1 at logic high state (near Vcc) and the node NO2 at logic low state. In this case, even if a word line W/L1 connected to gate of a pass transistor N1 in the memory cell MC1 is enabled at a memory access mode, the driving transistor P1 is not turned on because a drain of the driving transistor P1 is at a higher voltage than a source thereof. This is because the supply voltage Vcc typically has a higher potential value than the cell supply voltage CVCC. Accordingly, a current path through which the cell supply voltage CVCC can be applied to the node NO1 through the pass transistor N1 is blocked so as to prevent from the bit line floating.

Since potential values of the pair of bit lines B/LB,B/L are identical with each other at a stand-by mode in case of no "fuse-programming", the bit line floating prevent part 20 can be considered to provide a short circuit between the pair of bit lines B/LB,B/L. At a memory access mode, the bit line floating prevent part 20 plays a role to fix potential values of the pair of bit lines B/LB,B/L in correspondence to a logic state of cell data.

Figure 3:
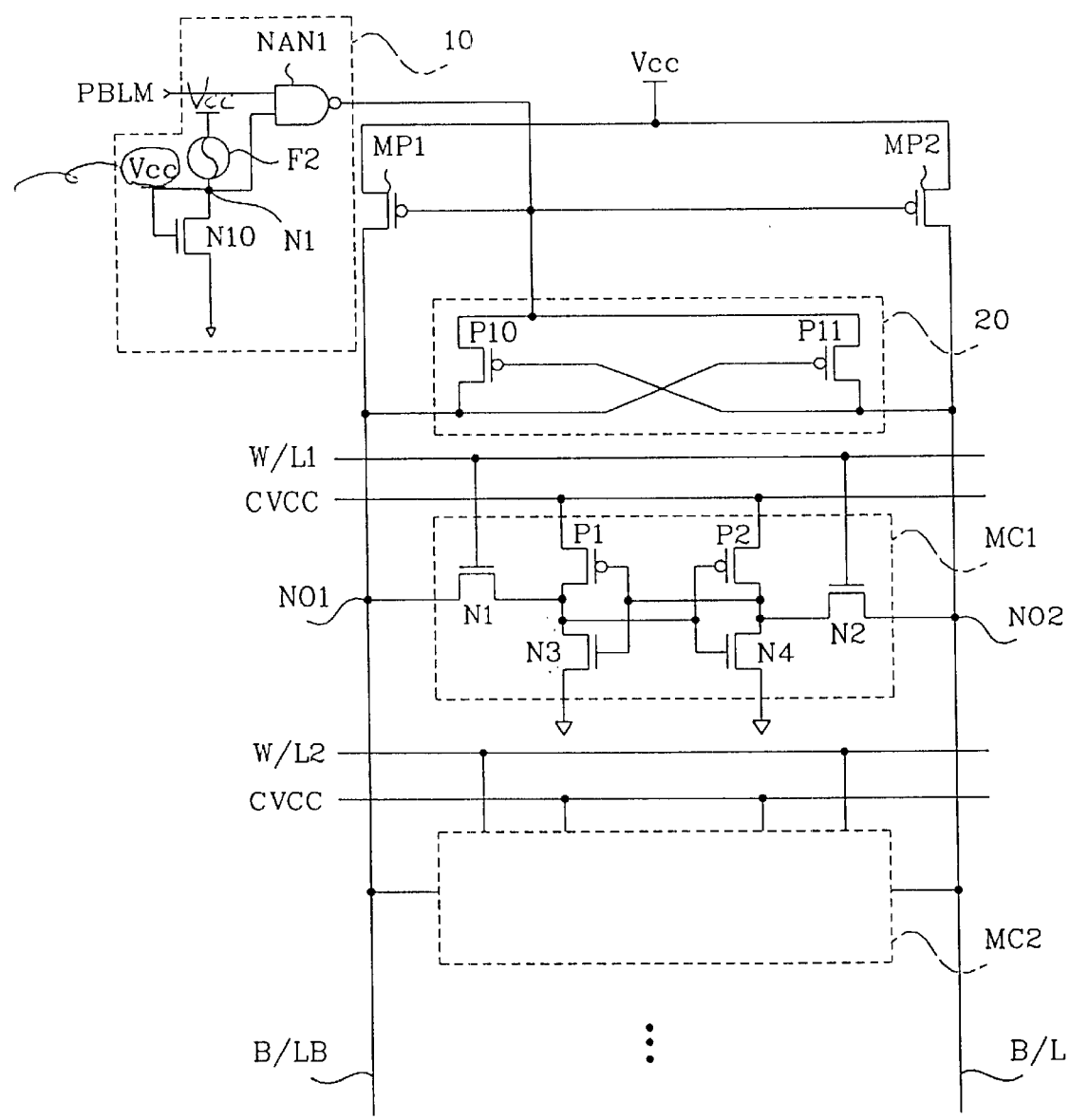
FIG. 3 is a circuit diagram of a part of a semiconductor memory device having redundancy memory cells in accordance with another embodiment of the present invention.

Referring to FIG. 3, there is provided a circuit diagram for illustrating a part of a semiconductor memory device having function for repairing a stand-by current failure in accordance with another embodiment of the present invention. Compared with the first embodiment in FIG. 2, the semiconductor memory device in FIG. 3 has distinction in power source of the bit line floating prevent part 20. In other words, the supply voltage Vcc is not used as a power source for the bit line floating prevent part 20, but output of the NAND gate NAN1 is used as a power source of the bit line floating prevent part 20.

In the semiconductor memory device in FIG. 3, operations of the parts are practically the same as those of the first embodiment in FIG. 2. In case of the "fuse-programming", a pair of cross-coupled PMOS transistors P10,P11 receive a high level signal through a common source. As a result, potential values of the pair of bit lines B/LB,B/L to which the supply voltage Vcc is stopped from being applied, are compensatively fixed, so that the cell supply voltage CVCC can not be applied to a defective bit line.

On the other hand, the pair of cross-coupled PMOS transistors P10,P11 receive a low level signal through a common source at a stand-by mode in case of no "fuse-programming". At this time, potential values of the pair of bit lines B/LB/L are identical, so that the pair of PMOS transistors P10,P11 are turned off. Thus, the pair of bit lines B/LB,B/L are pre-charged to a level of the supply voltage Vcc. At a memory access mode, the bit line floating prevent part 20 receives a high level signal, so that potential values of the pair of bit lines B/LB,B/L are fixed in correspondence to logic state of cell data.

As a result, a current leak path is prevented from being formed at a defective bit line, so that a hard type defect, such as a stand-by current failure, can be repaired independent of a state of the pre-charge control signal alternately shifting between logic high and low levels.

While the invention has been described with reference to the accompanying drawings in terms of the preferred embodiments, those skilled in the art will recognize that the invention can be practiced with various changes and modifications within the spirit and scope of the appended claims. For example, although a description has been made in that a pair of bit lines are pre-charged at a full level of supply voltage, a different application may be made to pre-charge a pair of bit lines at a half level of supply voltage. Also, it should be noted that there may be changes and modifications in the detailed structure of the bit line charging control part and the bit line floating prevent part.

As described above, there is an advantage in the present invention in that a hard type defect such as a stand-by current failure can be repaired regardless of a logic state of a pre-charge control signal, thereby reducing the probability of occurrence of defect in a semiconductor memory device and thus increasing yield of manufacturing good semiconductor memory devices.

What is claimed is:

1. A semiconductor memory device having a plurality of memory cells and pairs of bit lines, the plurality of memory cells being connected with a pair of bit lines, the semiconductor memory device comprising:

a pre-charging part for pre-charging one pair of the pairs of bit lines in response to a first state control signal output at a stand-by mode of the semiconductor memory device;

a bit line charging control part for generating the first state control signal in response to a pre-charge relating signal and generating a second state control signal, the second state control signal being generated when a stand-by current failure occurs due to a detect in the one pair of bit lines, wherein the second state control signal is independent of the pre-charge relating signal and when activated, causes a circuit in the pre-charging part to cut-off supply voltage from being applied to the one pair of bit lines; and a bit line floating prevent part for compensating potential values of the one pair of bit lines having the defect so that each bit line of the one pair has a fixed potential value, wherein a memory cell connected to the one pair of bit lines is disconnected to a cell supply voltage in response to the fixed potential values of the bit lines, thereby preventing the cell supply voltage from being applied to the one pair of bit lines during a memory access mode of the semiconductor memory device.

2. The semiconductor memory device as defined in claim 1, wherein the bit line charging control part comprises:

a fuse with a first terminal connected to the supply voltage;

a transistor having a conduction path connected between a second terminal of the fuse and a ground voltage; and a logic gate for receiving a signal from the second terminal of the fuse and the pre-charge relating signal and performing a predetermined logic operation to generate one of the first state control signal and the second state control signal.

3. The semiconductor memory device as defined in claim 2, wherein the fuse is cut off when the stand-by current failure occurs.

4. The semiconductor memory device as defined in claim 2, wherein the transistor is an NMOS transistor having drain and gate electrodes commonly connected to the second terminal of the fuse and a source electrode connected to the ground voltage.

5. The semiconductor memory device as defined in claim 2, wherein the logic gate is a NAND gate having a first input connected to the second terminal of the face, a second input receiving the pre-charge relating signal, and an output generating one of the first state control signal and the second state control signal.

6. The semiconductor memory device as defined in claim 1, wherein the bit line floating prevent part includes a pair of transistors which are cross-coupled and connected with the one pair of bit lines, wherein during the memory access mode each of the pair of transistors compensates a potential value of one of the pair of bit lines such that the potential values of the one pair of bit lines are fixed.

7. The semiconductor memory device as defined in claim 1, wherein the bit line floating prevent part comprises a pair of cross-coupled PMOS transistors having drain electrodes commonly connected to the supply voltage and source electrodes each of which is connected to a gate electrode of the other transistor and connected to one of the one pair of bit lines.

8. The semiconductor memory device as defined in claim 1, wherein the memory cells are fall CMOS transistor cells.

9. A static random access memory including memory cells, pairs of bit lines oriented in columns, and word lines oriented in rows, each of the memory cells being connected to a pair of bit lines and a word line, the static random access memory comprising:

a control signal generating part for generating a first state control signal in response to a pre-charge relating signal externally applied and for generating a second state control signal independent of the pre-charge relating signal when a stand-by current failure occurs due to a defect in a pair of bit lines;

a pre-charging part for pre-charging the pair of bit lines with a supply voltage in response to the first state control signal and for cutting off the supply voltage from being applied to the pair of bit lines in response to the second state control signal; and a bit line floating prevent part for compensating potential values of the pair of bit lines with defect so that each bit line of the pair has a fixed potential value, wherein a memory cell connected to the pair of bit lines is disconnected to a cell supply voltage in response to the fixed potential values of the bit lines, thereby preventing the cell supply voltage from being applied to the pair of bit lines with defect at a memory access mode when there is occurrence of the stand-by current failure, wherein the fixed potential values correspond to the potential values of logic state of cell data during a memory access mode if there is no occurrence of the stand-by current failure.

10. The static random access memory as defined in claim 9, wherein the control signal generating part generates the second state control signal when at least one of the pair of bit lines contacts a wire having a ground voltage level.

11. The static random access memory as defined in claim 9, wherein the bit line floating prevent part receives the second state control signal from the control signal generating part when the stand-by current failure occurs.

12. The static random access memory as defined in claim 9, wherein the control signal generating part comprises:
   a polysilicon fuse having a first terminal connected with the supply voltage, the polysilicon fuse being cut off when the stand-by current occurs;
   an NMOS transistor having drain and gate electrodes commonly connected to a second terminal of the fuse and a source electrode connected to a ground voltage;
   and a NAND gate having inputs for respectively receiving a logic state obtained at the second terminal of the fuse and the pre-charge relating signal and having an output to generate a NAND response as a control signal.

13. The static random access memory as defined in claim 12, wherein the bit line floating prevent part comprises a pair of cross-coupled PMOS transistors having drain electrodes commonly connected to the output of the NAND gate and source electrodes each of which is connected to a gate electrode of the other transistor and connected to an opposite one of the pair of bit lines.

14. The static random access memory as defined in claim 12, wherein the pre-charging part comprises a pair of PMOS transistors having source electrodes commonly connected to the supply voltage, gate electrodes commonly connected to the output of the NAND gate, and drain electrodes respectively connected to the pair of bit lines.

15. A method for repairing a stand-by current failure in a semiconductor memory device having memory cells, pairs of bit lines oriented in a column direction, and word lines oriented in a row direction, each of the memory cells being connected to a pair of bit lines and a word line, the method comprising the steps of:
   generating a pre-charge prevent signal to prevent a supply voltage from being applied to a pair of bit lines when at least one of the pair of bit lines is defective;
   compensating potential values of the defective one of the pair of bit lines to have fixed potential values;
   disconnecting a cell supply voltage with a memory cell connected to the defective one of the pair of bit lines in response to the fixed potential value of the bit lines; and
   blocking a current path through which the cell supply voltage is applied to the defective one of the pair of bit lines during a memory access mode.

16. The method as defined in claim 15, further including the step of generating a control signal to a pre-charging part receiving the supply voltage to precharge the pair of bit lines at a level of the supply voltage when there is no defect in the pair of bit lines.

17. The method as defined in claim 15, wherein the step of generating the pre-charge prevent signal includes the step of cutting off a fuse to make the pre-charge prevent signal independent of an externally applied pre-charge relating signal when the at least one of the pair of bit lines becomes defective.

18. A method for preventing a defective bit line from forming a current path through which current flows to ground in semiconductor memory device having memory cells respectively connected to pairs of bit lines arranged in column direction and word lines arranged in row direction, the method comprising the steps of:
   generating a pre-charge prevent signal by programming a fuse to be cut off to prevent a pre-charging part from applying a supply voltage to a pair of bit lines when there is defect in the pair of bit lines, the pre-charge prevent signal being independent of a logic state of a pre-charge relating signal externally applied; and
   compensating potential values of the defective bit lines to have fixed potential values;
   blocking a current path through which a cell supply voltage is applied to the defective bit lines at a memory access mode by disconnecting the cell supply voltage with a memory cell connected to the defective bit lines in response to the fixed potential values.

* * * * *